US010910399B2

(12) United States Patent
Lue

(10) Patent No.: US 10,910,399 B2
(45) Date of Patent: Feb. 2, 2021

(54) THREE DIMENSIONAL MEMORY DEVICE AND METHOD FOR FABRICATING THE SAME

(71) Applicant: MACRONIX INTERNATIONAL CO., LTD., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/353,028

(22) Filed: Mar. 14, 2019

(65) Prior Publication Data

US 2020/0295031 A1 Sep. 17, 2020

(51) Int. Cl.
*H01L 29/792* (2006.01)
*H01L 27/11582* (2017.01)
(Continued)

(52) U.S. Cl.
CPC .. *H01L 27/11582* (2013.01); *H01L 21/31144* (2013.01); *H01L 21/76224* (2013.01);
(Continued)

(58) Field of Classification Search
CPC ......... H01L 21/31144; H01L 21/76224; H01L 27/11565; H01L 27/11582; H01L 29/0642; H01L 29/40117
(Continued)

(56) References Cited

U.S. PATENT DOCUMENTS 9,209,092 B2 12/2015 Yamazaki et al.
9,397,110 B2 7/2016 Lue
(Continued)

FOREIGN PATENT DOCUMENTS

CN 109427807 A 3/2019
CN 109461756 A 3/2019
(Continued)

OTHER PUBLICATIONS

TW Office Action dated Sep. 11, 2019 in Taiwan application (No. 108108713).
(Continued)

*Primary Examiner* — Tan N Tran
(74) *Attorney, Agent, or Firm* — McCure, Qualey & Rodack, LLP

(57) ABSTRACT

A three-dimensional memory device includes a substrate, a plurality of conductive layers and insulating layers, a memory layer stack, an isolation portion, a second hole and a dielectric filler. The conductive layers and insulating layers are alternately stacked over the substrate to form a multi-layer stacked structure. The multi-layer stacked structure includes multiple first holes, and each first hole passing through the conductive layers and the insulating layers. The memory layer stack has a first string portion, a second string portion and a bottom string portion connected between the first and second string portions. The isolation portion is embedded among the first, second and bottom string portions of each of the memory layer stacks in the first holes. The dielectric filler is located on the isolation portion and has side protrusions in contact with the conductive layers.

13 Claims, 17 Drawing Sheets

(51) Int. Cl.
*H01L 27/11565* (2017.01)
*H01L 21/311* (2006.01)
*H01L 29/06* (2006.01)
*H01L 21/762* (2006.01)
*H01L 21/28* (2006.01)

(52) U.S. Cl.
CPC .... *H01L 27/11565* (2013.01); *H01L 29/0642* (2013.01); *H01L 29/40117* (2019.08)

(58) Field of Classification Search
USPC ........................................................ 257/324
See application file for complete search history.

(56) References Cited

U.S. PATENT DOCUMENTS

| | | |
|---|---|---|
| 9,520,485 B2 | 12/2016 | Lue |
| 9,698,156 B2 | 7/2017 | Lue |
| 9,748,264 B1 | 8/2017 | Jiang et al. |
| 9,842,907 B2 | 12/2017 | Makala et al. |
| 10,103,160 B2 | 10/2018 | Jayanti et al. |
| 2010/0207194 A1 | 8/2010 | Tanaka et al. |
| 2018/0166553 A1 | 6/2018 | Lee et al. |
| 2018/0226423 A1* | 8/2018 | Kang ................ H01L 27/11582 |
| 2018/0301564 A1 | 10/2018 | Kwon et al. |
| 2019/0067429 A1 | 2/2019 | Lee et al. |
| 2019/0157345 A1 | 5/2019 | Zhu et al. |
| 2019/0259761 A1 | 8/2019 | Takemura et al. |
| 2019/0333923 A1* | 10/2019 | Kim ................ H01L 27/11573 |
| 2020/0194449 A9* | 6/2020 | Eom ................ H01L 27/1157 |

FOREIGN PATENT DOCUMENTS

| | | |
|---|---|---|
| JP | 2018191010 A | 11/2018 |
| TW | 201834079 A | 9/2018 |
| TW | 201834219 A | 9/2018 |
| TW | 201904056 A | 1/2019 |
| TW | I646634 B | 1/2019 |

OTHER PUBLICATIONS

Rino Micheloni et al., Architectural and Integration Options for 3D NAND Flash Memories, Computers 2017, 6, 27, Published on Aug. 10, 2017.

Andrea Silvagni, 3D NAND Flash Based on Planar Cells, Computers 2017, 6, 28, Published on Oct. 24, 2017.

U.S. Appl. No. 16/231,644, filed Dec. 24, 2018.

* cited by examiner

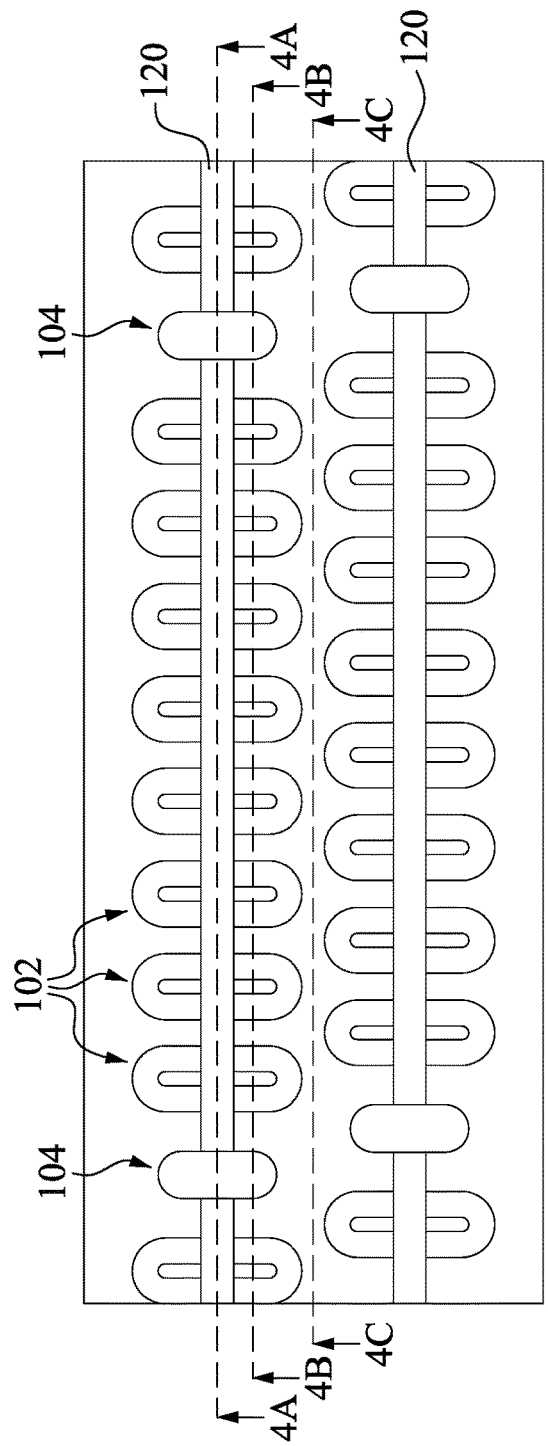
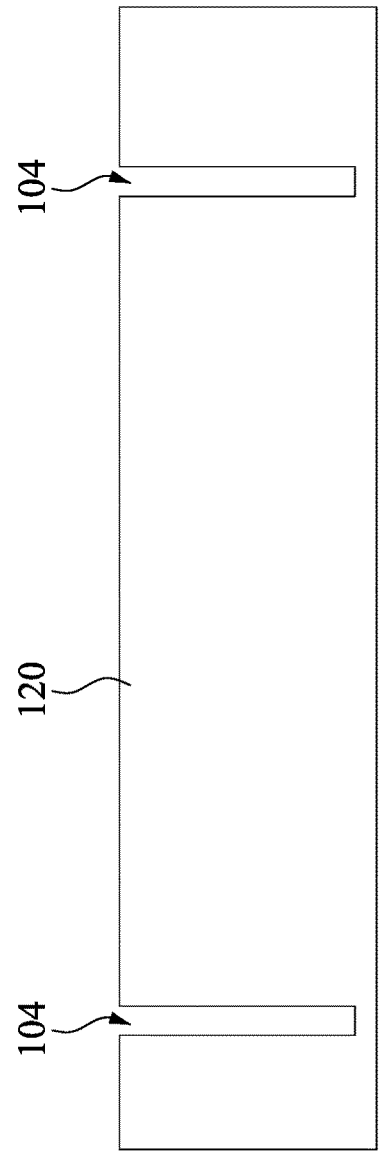
Fig. 4
Fig. 4A

THREE DIMENSIONAL MEMORY DEVICE AND METHOD FOR FABRICATING THE SAME

BACKGROUND

Field of Invention

The present disclosure relates to a memory device and method for fabricating the same, and more particularly to a high-density three dimensional (3D) memory device and method for fabricating the same.

Description of Related Art

Memory devices are important device to a portable electric apparatus, such as a MP3 displayer, a digital camera, a notebook, a cell phone . . . and so on, for data storage. As the increasing applications and functions required by the users, the trend for the memory devices pursues higher storage density and smaller cell size. To satisfy this requirement, designers have been looking for techniques to provide a 3D memory device with stacked multiple planes of memory cells, such as a vertical-channel (VC) NAND flash memory device.

However, as critical dimensions of devices in integrated circuits shrink to the limits of common memory cell technologies, how to achieve greater storage capacity within a smaller memory device without deteriorate its operation performance have become a challenge to the persons skilled in the art. Therefore, there is a need of providing an improved 3D memory device and the method for fabricating the same to obviate the drawbacks encountered from the prior art.

SUMMARY

One aspect of the present disclosure is to provide a three-dimensional memory device including a substrate, a plurality of conductive layers and insulating layers, a memory layer stack, an isolation portion, a second hole and a dielectric filler. The conductive layers and insulating layers are alternately stacked over the substrate to form a multi-layer stacked structure. The multi-layer stacked structure includes multiple first holes arranged along a first direction, and each first hole passing through the conductive layers and the insulating layers. The memory layer stack having a first string portion disposed on a first side of a sidewall of each of the first holes, a second string portion disposed on an opposite second side of the sidewall, and a bottom string portion connected between the first and second string portions. The isolation portion is arranged along the first direction and embedded among the first, second and bottom string portions of each of the memory layer stacks in the first holes. The second hole is located between adjacent two of the first holes. The dielectric filler is filled within the second hole.

Another aspect of the present disclosure is to provide a method for fabricating a three-dimensional memory device including steps of alternately depositing two different insulating layers over a substrate to form a multi-layer stacked structure; etching multiple first holes on the multi-layer stacked structure along a first direction, each first hole passing through the two different insulating layers; forming a memory layer stack in each first hole, the memory layer stack having a first string portion disposed on a first side of a sidewall of each first hole, a second string portion disposed on an opposite second side of the sidewall, and a bottom string portion connected between the first and second string portions; etch a slit trench across the first holes along the first direction; filling a dielectric material into the slit trench to form an isolation portion embedded among the first, second and bottom string portions of each of the memory layer stacks in the first holes; etching a second hole between adjacent two of the first holes; removing one of the two different insulating layers; depositing a conductive material into the second hole to form conductive layers between the remaining insulating layers; etching excess conductive layers in the second hole to space adjacent conductive layers from one another; and depositing a dielectric filler into the second hole.

In one or more embodiments, the second hole has an inner diameter greater than a width of the isolation portion.

In one or more embodiments, the dielectric filler has side protrusions.

In one or more embodiments, at least one of the side protrusions has a width greater than the inner diameter of the second hole.

In one or more embodiments, the second hole has an inner diameter smaller than that of each of the first holes.

In one or more embodiments, the conductive layers are made from tungsten and the insulating layers are made from silicon oxide.

In one or more embodiments, the memory layer stack includes a U-shaped channel layer and a U-shaped storage layer wrapping around the channel layer.

In one or more embodiments, the bottom string portion of the memory layer stack is disposed in a corresponding conductive layer of the multi-layer stacked structure.

In one or more embodiments, three-dimensional memory device further includes a buried oxide layer between the substrate and the multi-layer stacked structure, the isolation portion has a bottommost end aligned with a bottommost one of the conductive layers of the multi-layer stacked structure or aligned with the buried oxide layer.

In one or more embodiments, each side protrusion is sandwiched between immediately-adjacent two of the insulating layers.

In one or more embodiments, the conductive material includes tungsten, and the isolation portion is made from silicon oxide.

In one or more embodiments, the dielectric filler has a width greater than that of the isolation portion.

In one or more embodiments, the dielectric filler is in contact with the isolation portion.

In one or more embodiments, the method further includes a step of removing one of the two different insulating layers until the memory layer stack is exposed in the second hole.

In one or more embodiments, the method further includes a step of etching the second hole such that the second hole has an inner diameter greater than a width of the isolation portion.

In one or more embodiments, the method further includes a step of etching the second hole such that the second hole has an inner diameter smaller than that of each of the first holes.

In one or more embodiments, the method further includes a step of etching excess portions of the conductive layers to form sidewall concaves on the conductive layers in the second hole.

In one or more embodiments, the two different insulating layers include a silicon oxide layer and a silicon nitride layer.

In sum, a hemi-cylindrical three-dimensional semiconductor memory device includes additional holes on the isolation portion to remove sacrificial insulating layers and replaced with conductive gate layers. The additional holes are etched or drilled after all hemi-cylindrical memory layer stacks are formed penetrating a multi-layer stacked structure of two different alternately stacked insulating layers. The gate replacement process can be performed through the additional holes to form conductive layers to replace the sacrificial insulating layers. Dielectric fillers with side protrusions are finally deposited into the additional holes to space from adjacent conductive layers from one another.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 4-8 illustrate top views of a method for manufacturing a semiconductor memory device at various stages in accordance with some embodiments of the present disclosure;

FIGS. 4A-8A illustrate cross sectional views of a method for manufacturing a semiconductor memory device at various stages in accordance with some embodiments of the present disclosure;

FIGS. 4B-8B illustrate cross sectional views of a method for manufacturing a semiconductor memory device at various stages in accordance with some embodiments of the present disclosure;

FIGS. 4C-8C illustrate cross sectional views of a method for manufacturing a semiconductor memory device at various stages in accordance with some embodiments of the present disclosure;

DETAILED DESCRIPTION

Figure 1:
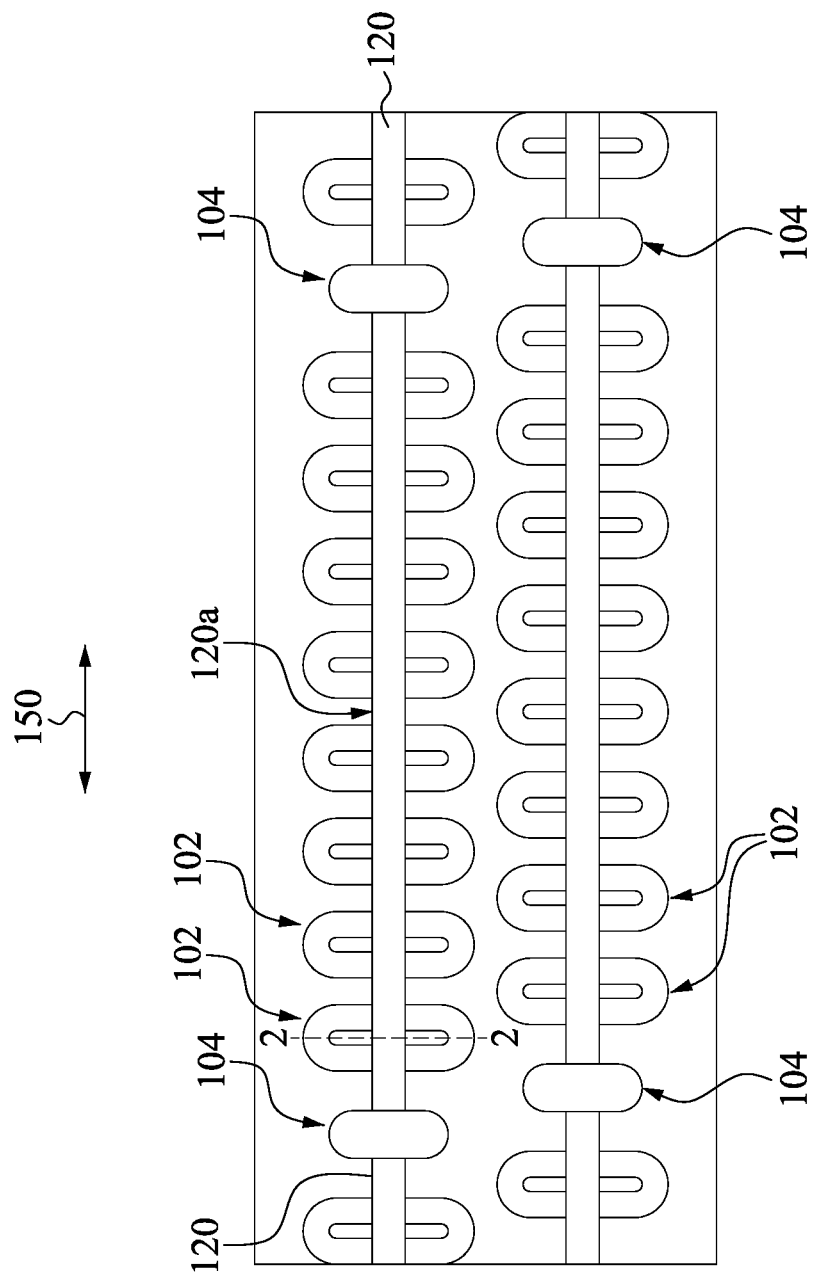
FIG. 1 illustrates a top view of a multi-layer stacked structure in accordance with one embodiment of the present disclosure.

The embodiments as illustrated below provide a 3D memory device and the method for fabricating the same to achieve greater storage capacity within a smaller memory device without deteriorating its operation performance. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

Figure 2:
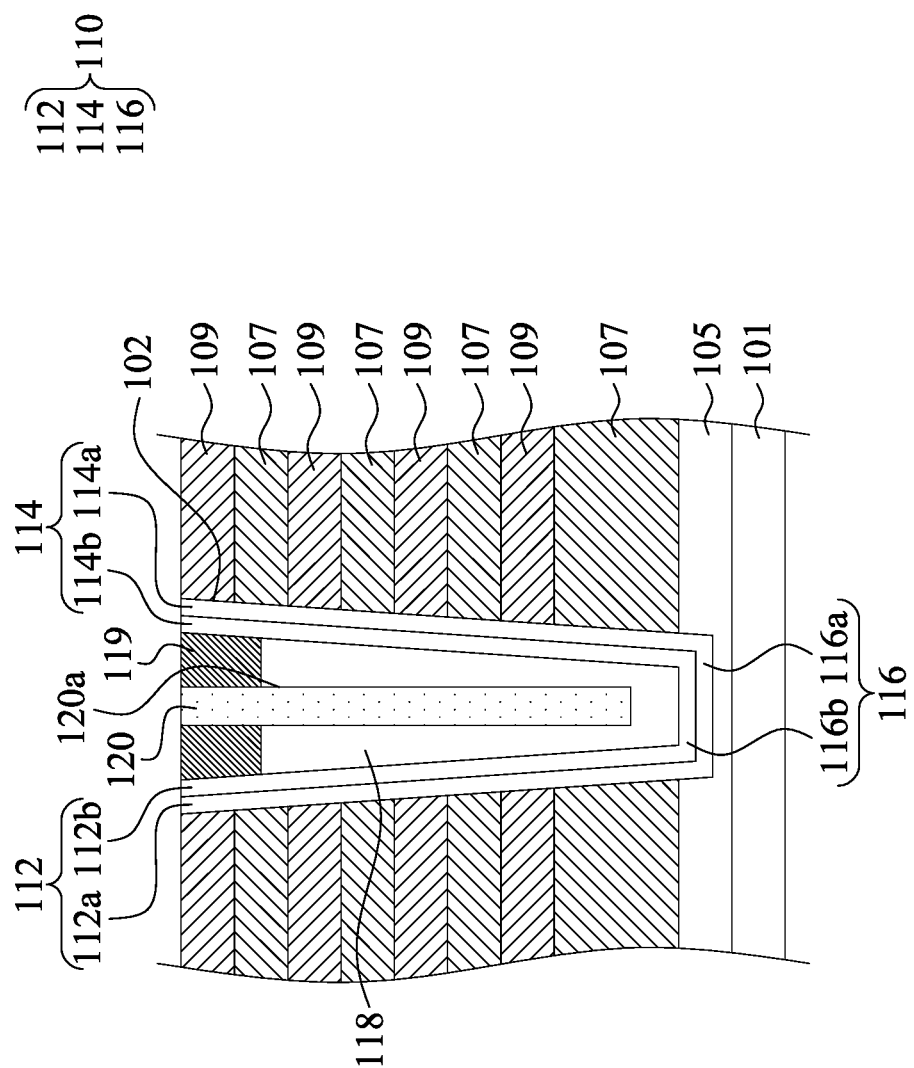
FIG. 2 illustrates a cross sectional view of the multi-layer stacked structure taken along the line 2-2 in FIG. 1.

Reference is made to FIGS. 1 and 2. FIG. 1 illustrates a top view of a multi-layer stacked structure in accordance with one embodiment of the present disclosure, and FIG. 2 illustrates a cross sectional view of the multi-layer stacked structure taken along the line 2-2 in FIG. 1. A semiconductor memory device is formed by alternately depositing two different insulating layers (107, 109) over a substrate 101 to form a multi-layer stacked structure.

In some embodiments of the present disclosure, the device may further include a buried oxide layer 105 between the substrate 101 and the multi-layer stacked structure (107, 109). In the present embodiment, the buried oxide layer 102 is formed by a thermal oxidation process directly performed on a surface of the substrate 101. In other embodiments of the present disclosure, the buried oxide layer 102 may be formed by a deposition process performed on the surface of the substrate 101.

In the present embodiment, the two different insulating layers (107, 109) may be silicon nitride layers and silicon oxide layers respectively. In other embodiments of the present disclosure, the two different insulating layers may be two of the dielectric materials such as silicon oxide, silicon nitride, silicon oxynitride, silicate, etc. In some embodiments of the present disclosure, the two different insulating layers (107, 109) are chosen from two dielectric materials that have a relatively strong etching resistivity and a relatively weak etching resistivity to a predetermined etchant.

A etch step is performed to form multiple holes 102 on the multi-layer stacked structure along a direction 150 so as to form an array of holes, i.e., multiple rows of holes. Each hole 102 passes through the multi-layer stacked structure (107, 109) along a direction substantially perpendicular to the direction 150. In some embodiments of the present disclosure, the multiple holes 102 may have an O-shaped, oval-shaped, ellipse-shaped or rounded rectangular circumference, but not being limited thereto. In some embodiments of the present disclosure, an anisotropic etching process, such as reactive ion etching (RIE) process is performed using a patterned hard mask (not shown) as an etching mask, to pattern the multiple holes 102 through the multi-layer stacked structure. The holes 102 stop at the buried oxide layer 105. In some embodiments of the present disclosure, the buried oxide layer 105 may serve as an etch stop layer for properly patterning the multiple holes 102.

A memory layer stack 110 is then formed in each hole 102 by a deposition process, e.g., a low pressure chemical vapor deposition (LPCVD) and blanket over an sidewall of each hole 102. Each memory layer stack 110 includes a string portion 112 located on a first side of a sidewall of each hole 102, a string portion 114 located on an opposite second side of the sidewall of each hole 102, and a bottom string portion 116 connected between bottom ends of the string portions (112, 114). In some embodiments of the present disclosure, the string portions (112, 114, 116) may collectively constitute a U-shaped memory layer stack.

Each memory layer stack 110 includes a storage layer (112a, 114a, 116a) and a channel layer (112b, 114b, 116b). In some embodiments of the present disclosure, the storage layer may be formed of a composite layer including a silicon oxide layer, a silicon nitride layer, and a silicon oxide layer (i.e., an ONO layer stack). However, the structure of the storage layer is not limited to this regard. In some other embodiments, the storage layer may be selected from a group consisting of an oxide-nitride-oxide-nitride-oxide (ONONO) structure, a silicon-oxide-nitride-oxide-silicon (SONOS) structure, a bandgap engineered silicon-oxide-nitride-oxide-silicon (BE-SONOS) structure, a tantalum nitride-aluminum oxide-silicon nitride-silicon oxide-silicon (TANOS) structure and a metal-high-k bandgap-engineered silicon-oxide-nitride-oxide-silicon (MA BE-SONOS) structure. In the present embodiment, the storage layer includes an ONO structure and the channel layer is made of poly-silicon.

Thereafter, a dielectric pillar 118 is formed into each hole 102 by deposit a dielectric material, and a planarization process, e.g., a CMP process, using the top surface of the multi-layer stacked structure (107, 109) as a stop layer, is performed to remove excess dielectric material.

An etching back process is then performed to remove a top portion of the dielectric pillar 118 for further filling a contact plug 119. The material used to constitute the contact plug 106 may include metals (such as Cu, Al, W or the metal ally thereof), doped or undoped semiconductor material (such as epitaxial single crystal silicon or poly-silicon (Si)/germanium (Ge) or other suitable material.

A slit trench 120a is etched across each row of the holes 102 along the direction 150 to cut the contact plug 119, the dielectric pillar 118, the storage layer and the channel layer. The contact plug 119 is thus divided into two parts. The storage layer and the channel layer (i.e., the memory layer stack 110) are thus cut to form a string portion 112 located on a first side of a sidewall of each hole 102, a string portion 114 located on an opposite second side of the sidewall of each hole 102, but a bottom string portion 116 is not cut by the slit trench 120a and still connected between bottom ends of the string portions (112, 114). In addition, the string portions (112, 114) are cut to form two opposite U-shaped string portions, and each string portion (112, 114) includes a U-shaped storage layer and a U-shaped channel layer that is wrapped around by the U-shaped storage layer. A dielectric material is then filled into the slit trench 120a to form a continuous isolation portion 120 embedded among the string portions (112, 114, 116) of each memory layer stack 110 as well as among the dielectric pillar 118 in the holes 102.

Figure 3:
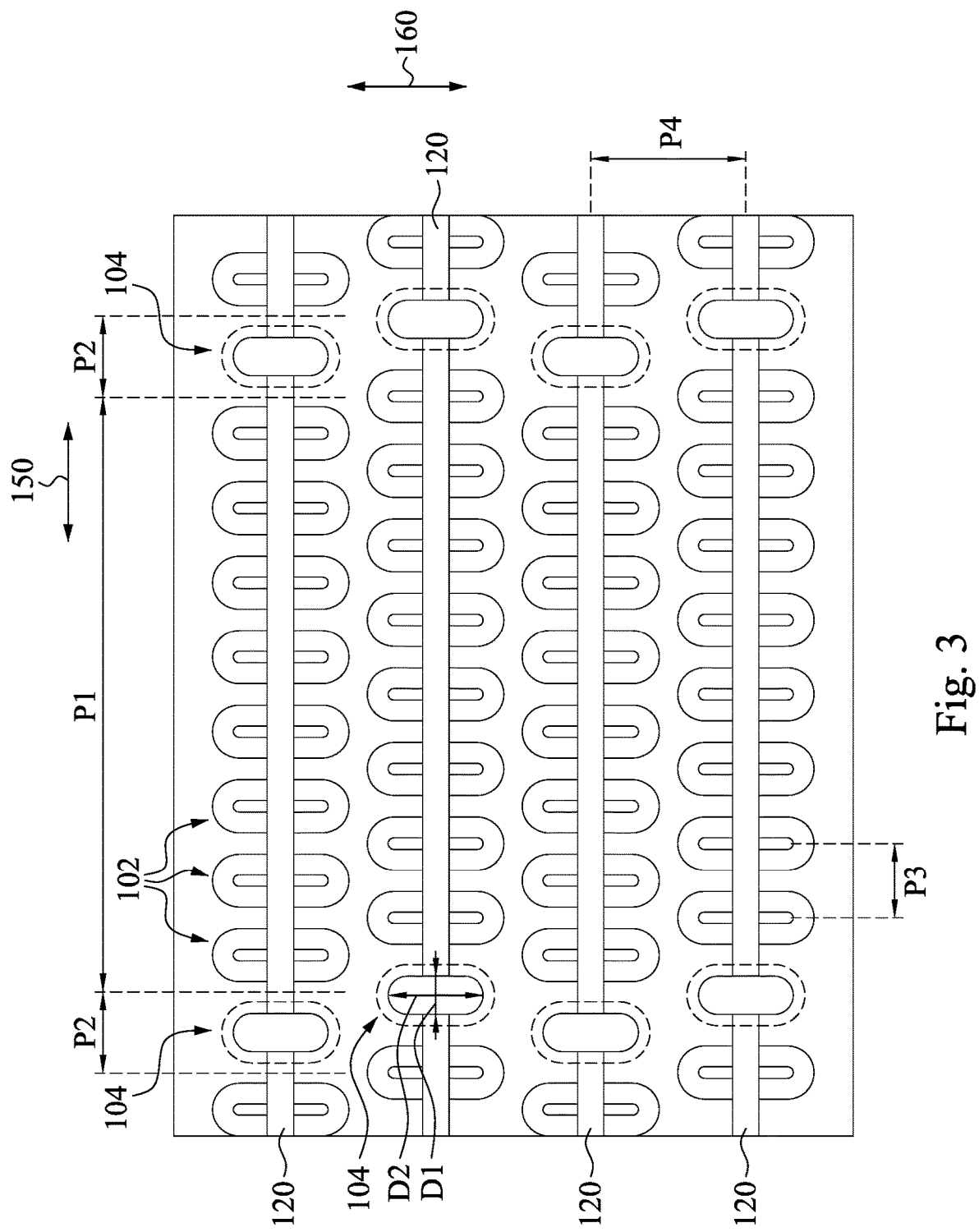
FIG. 3 illustrates a top view of a multi-layer stacked structure in accordance with another embodiment of the present disclosure.

Reference is made to FIG. 3, which illustrates a top view of a multi-layer stacked structure in accordance with another embodiment of the present disclosure. In order to have a process window for gate replacement step, another type of holes 104 are formed on the isolation portion 120 and between the holes 102.

The array of holes 102 are arranged with an overhead pitch (P3) along the direction 150 and an overhead pitch (P4) along the direction 160. In some embodiments of the present disclosure, the pitch (P3) ranges from about 100 nm to about 120 nm, and the pitch (P4) ranges from about 220 nm to about 240 nm. The holes 104 reduce the space for accommodating additional holes 102 in which the memory device is built, and a quantity of the holes 104 reduce a density of the memory devices. In some embodiments of the present disclosure, a ratio of an overhead pitch (P2) occupied by each hole 104 along the direction 150 to an overhead pitch (P1) occupied by the holes 102 between two adjacent holes 104 along the direction 150 ranges from about 5% to about 30%, i.e., the ratio of P2/P1 ranges from about 5% to about 30%, in order to achieve a better density of the memory devices. In some embodiments of the present disclosure, the ratio of P2/P1 is about 12.5% in order to achieve a better density of the memory devices. However, the ratio may be varied due to a desired density of the memory devices and/or capability limitations of processing equipment, and not being limited thereto.

In some embodiments of the present disclosure, each hole 104 has an inner diameter (D2) greater than a width of the isolation portion 120 along the direction 160. In some embodiments of the present disclosure, each hole 104 has an inner diameter (D1) smaller than an inner diameter of each hole 102 along the direction 150. In some embodiments of the present disclosure, each hole 104 has an inner diameter (D2) smaller than an inner diameter of each hole 102 along the direction 160.

Figure 4B:
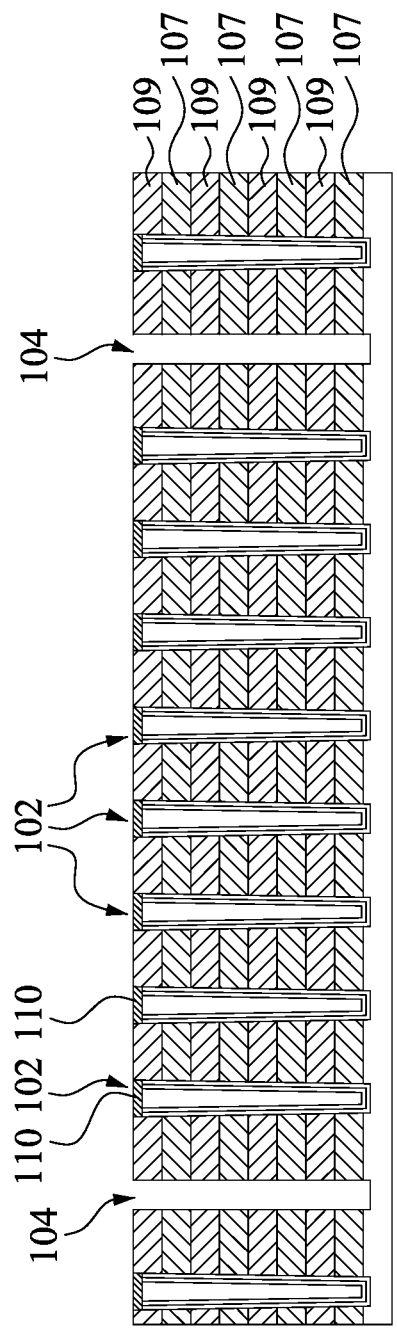
Figure 4C:
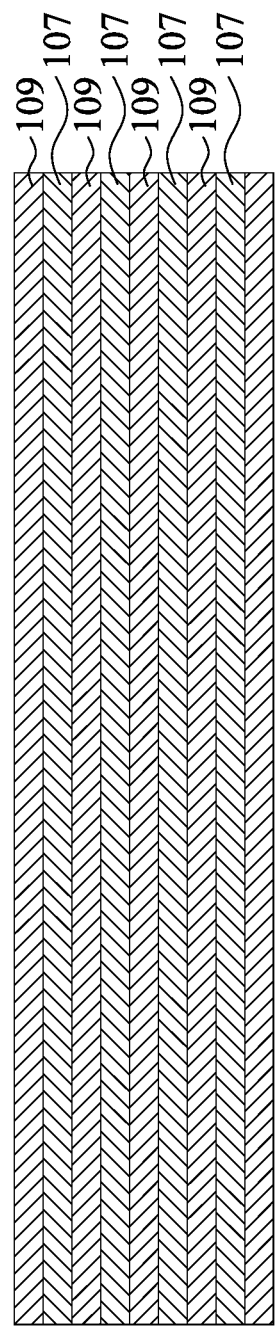

Reference is made to FIGS. 4-4C, FIG. 4A illustrates a cross sectional view taken along the line 4A-4A in FIG. 4, FIG. 4B illustrates a cross sectional view taken along the line 4B-4B in FIG. 4 and FIG. 4C illustrates a cross sectional view taken along the line 4C-4C in FIG. 4. Each hole 104 is formed on the isolation portion 120 to expose sidewalls of the multi-layer stacked structure (107, 109). The holes 104 may be etched by an anisotropic etching process, e.g., reactive ion etching (RIE) process, using a patterned hard mask (not shown) as an etching mask.

Figure 5:
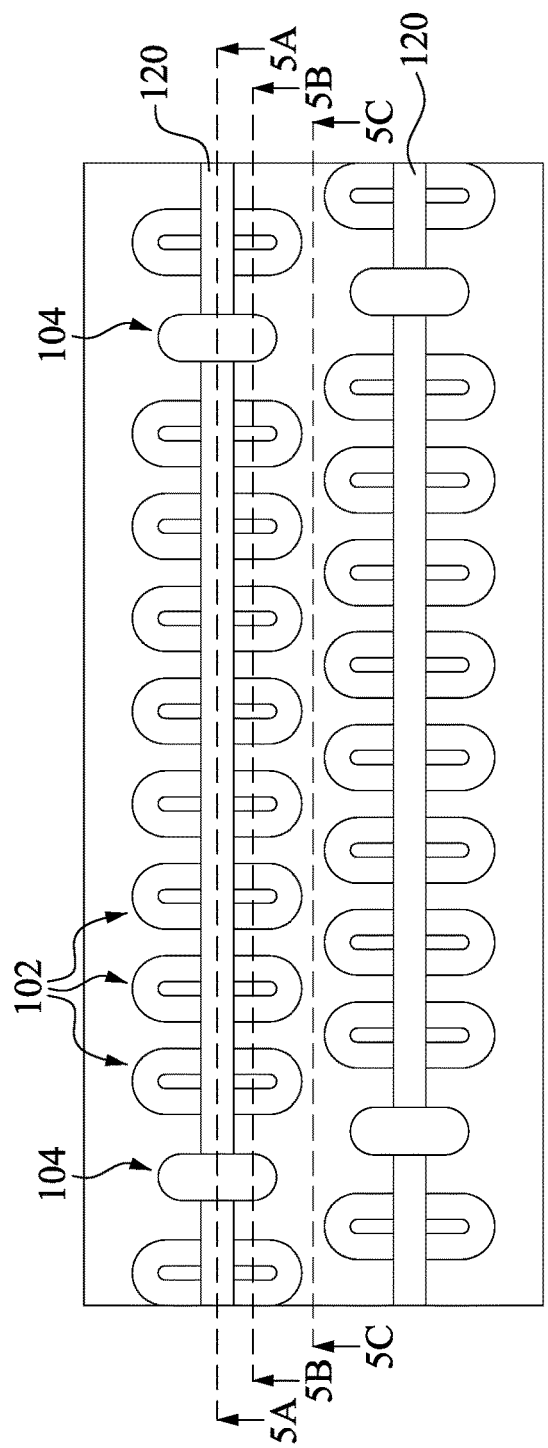
Figure 5A:
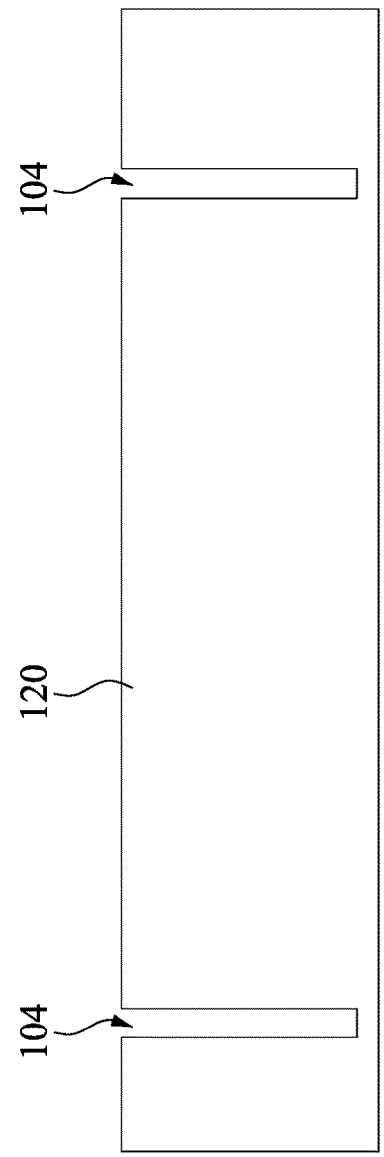
Figure 5B:
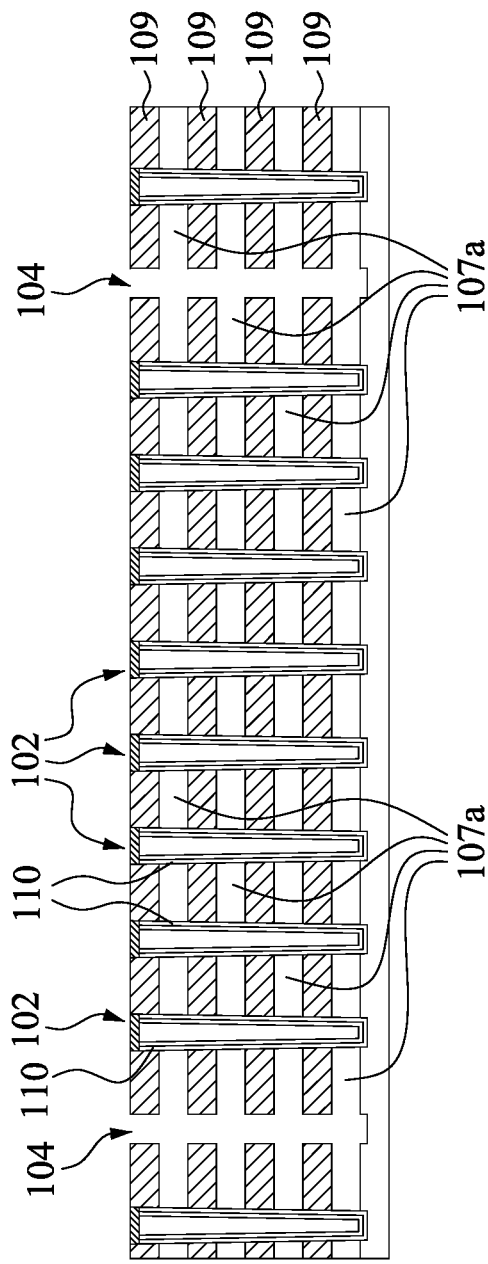
Figure 5C:
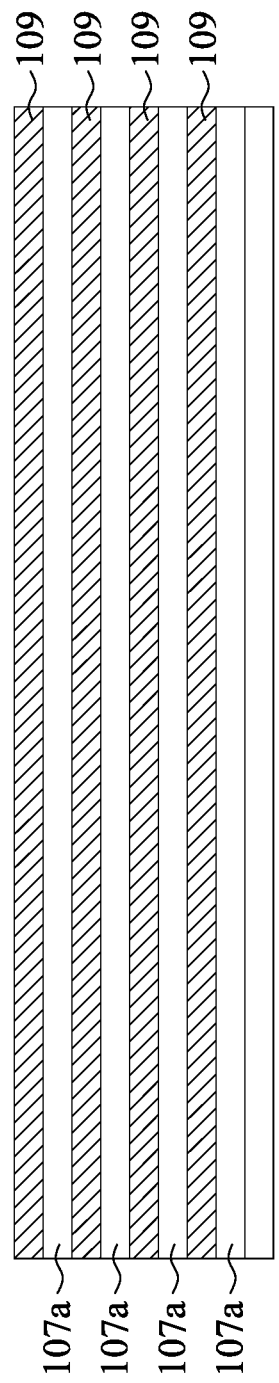

Reference is made to FIGS. 5-5C, FIG. 5A illustrates a cross sectional view taken along the line 5A-5A in FIG. 5, FIG. 5B illustrates a cross sectional view taken along the line 5B-5B in FIG. 5 and FIG. 5C illustrates a cross sectional view taken along the line 5C-5C in FIG. 5. A wet etching process is performed to remove the insulating layers 107 of the multi-layer stacked structure until a sidewall of the memory layer stack 110 is exposed in each hole 104. The wet etching process is performed by filling an etchant that has a much faster etch rate to the insulating layers 107 than to the insulating layers 109 such that all the insulating layers 107 between the insulating layers 109 will be almost removed so as to form voids 107a between the remaining (not being etched) insulating layers 109. Therefore, sidewalls, i.e., sidewalls of the storage layers (112a, 114a), of the memory layer stacks 110 are exposed in each hole 104. The U-shaped memory layer stacks 110 filled in the holes 102 serve as support pillars to retain the remaining insulating layers 109 such that the insulating layers 109 would not collapse due to the voids 107a therebetween.

Figure 6:
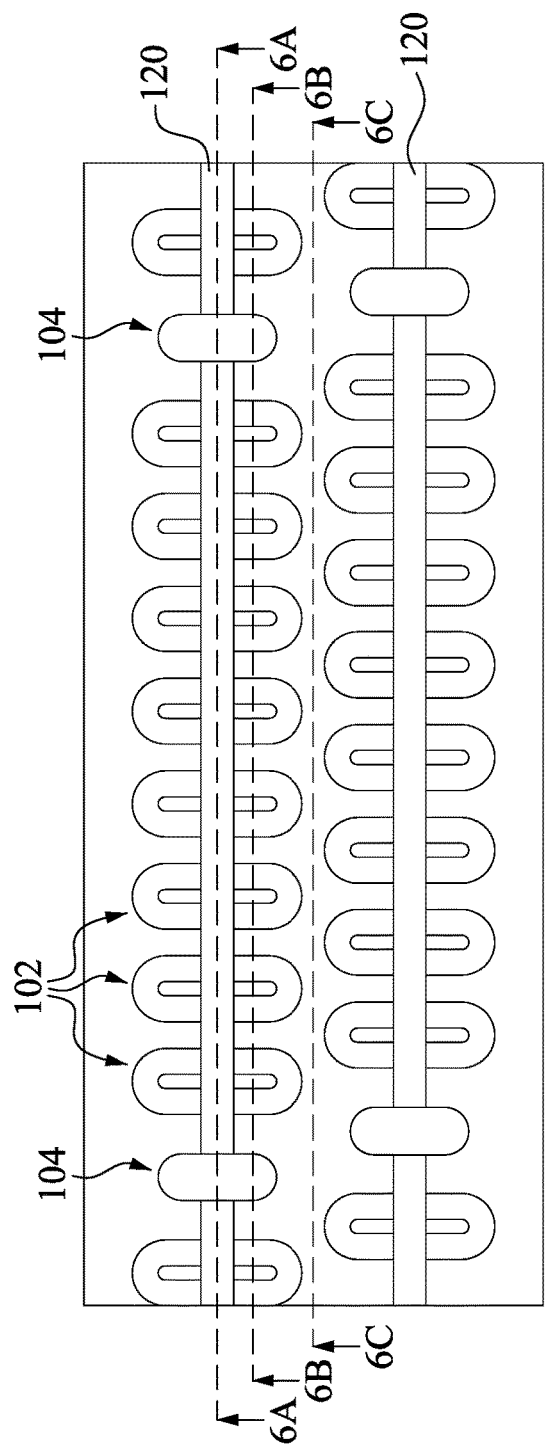
Figure 6A:
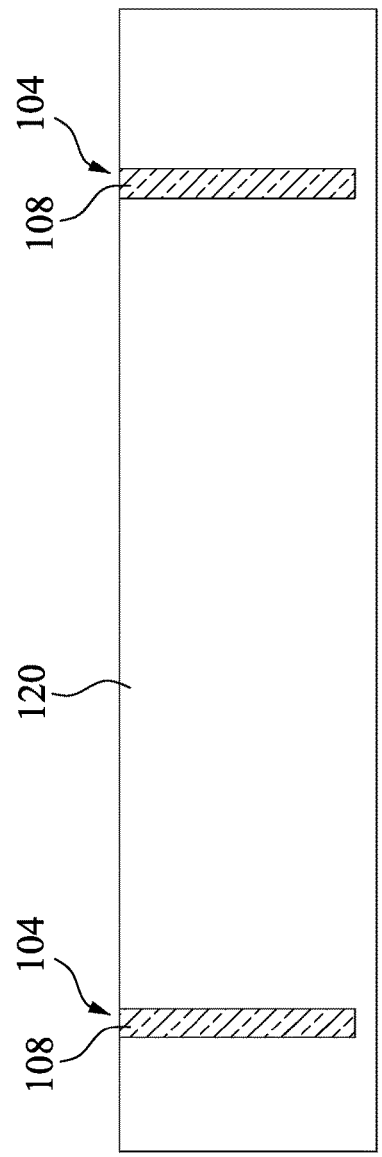
Figure 6B:
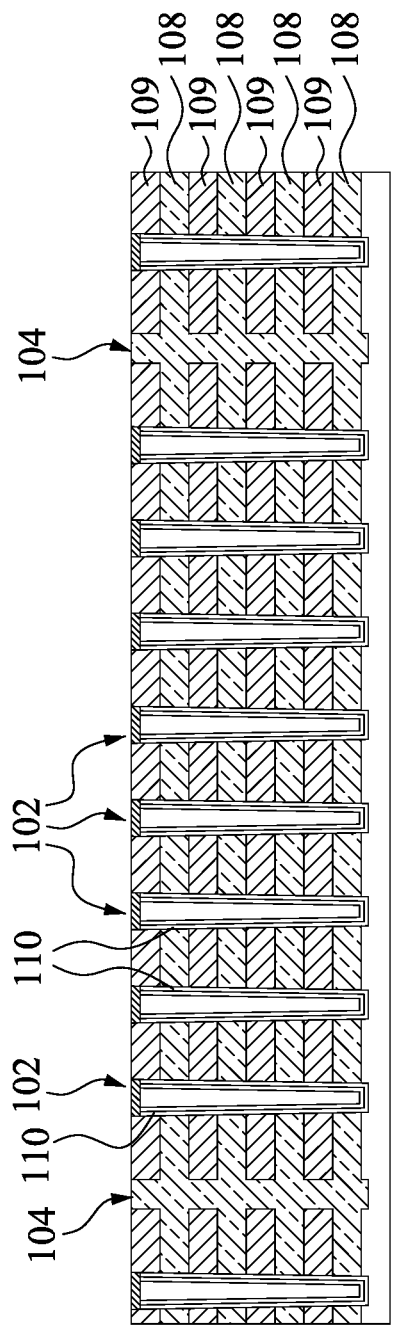
Figure 6C:
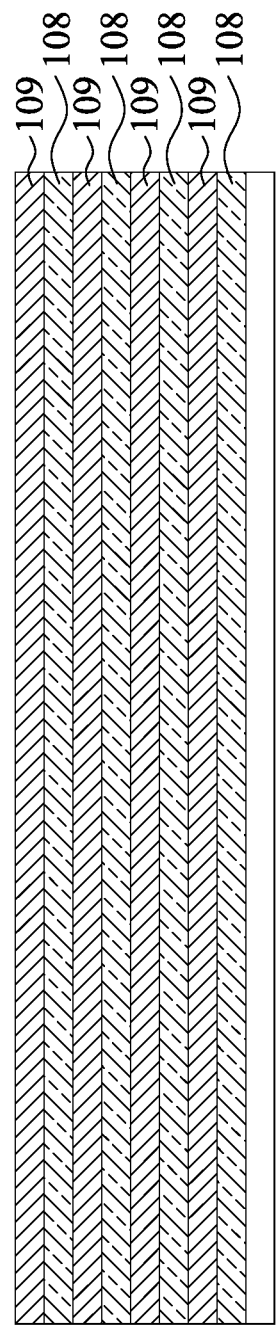

Reference is made to FIGS. 6-6C, FIG. 6A illustrates a cross sectional view taken along the line 6A-6A in FIG. 6, FIG. 6B illustrates a cross sectional view taken along the line 6B-6B in FIG. 6 and FIG. 6C illustrates a cross sectional view taken along the line 6C-6C in FIG. 6. A conductive material is deposited into the holes 104 to form conductive layers 108 to fill into the voids. Each conductive layer 108 should reach or contact exposed sidewalls of the memory layer stacks 110. The conductive material may include metals, such as Cu, Al, W or the metal alloys thereof.

Figure 7:
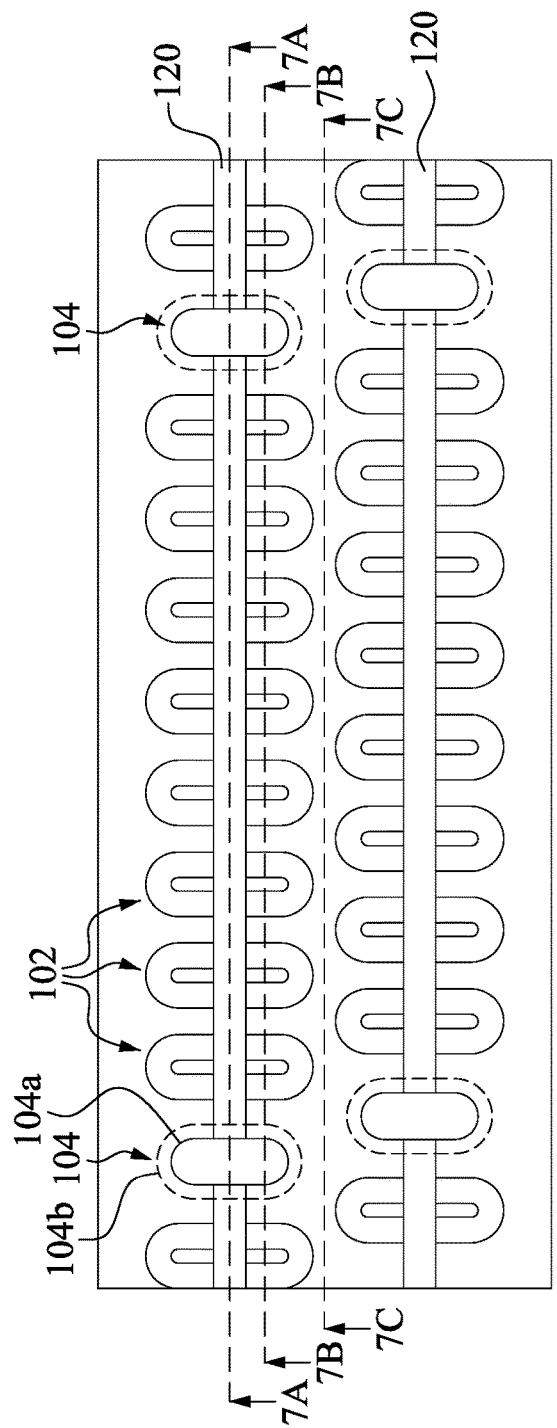
Figure 7A:
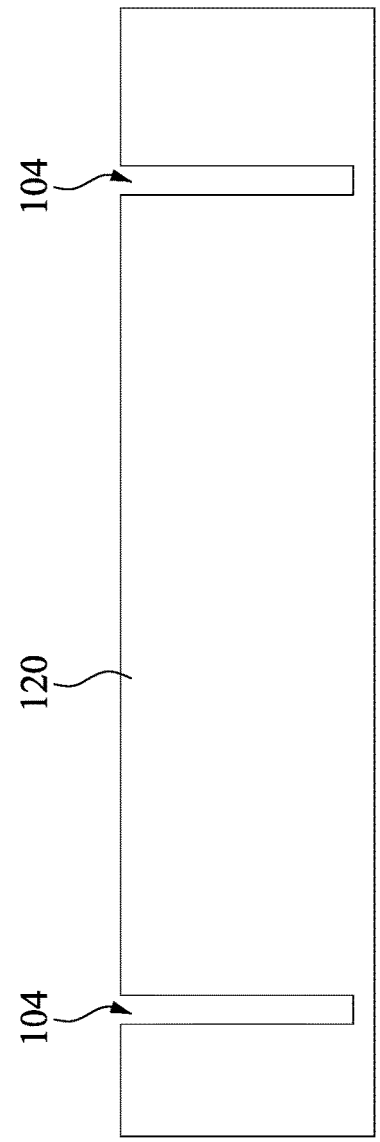
Figure 7B:
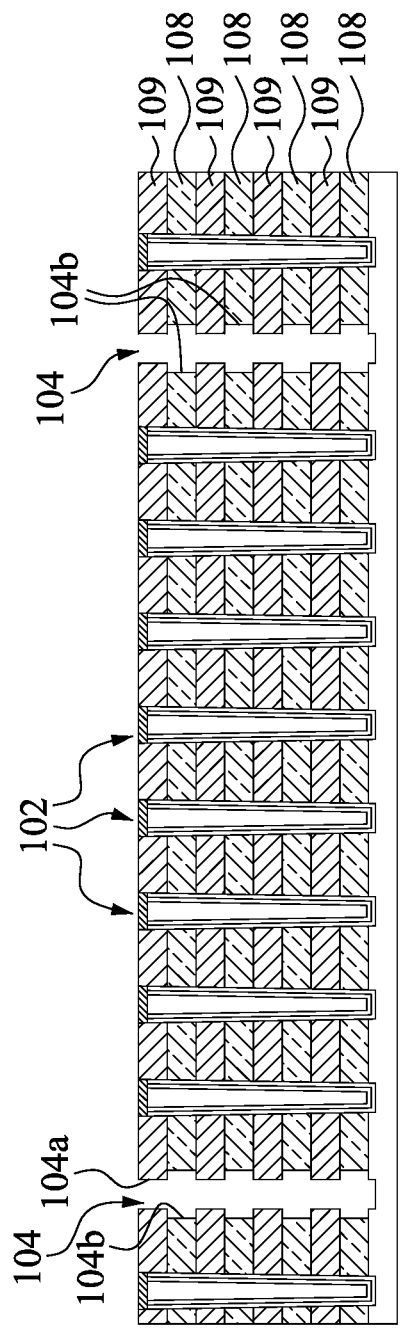
Figure 7C:
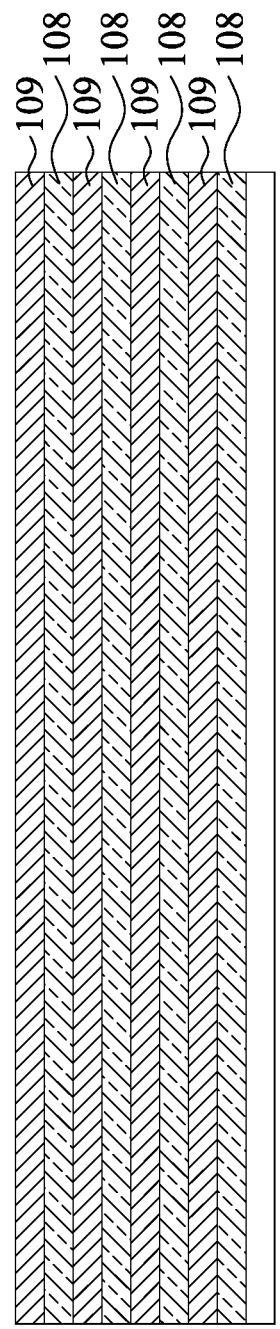

Reference is made to FIGS. 7-7C, FIG. 7A illustrates a cross sectional view taken along the line 7A-7A in FIG. 7, FIG. 7B illustrates a cross sectional view taken along the line 7B-7B in FIG. 7 and FIG. 7C illustrates a cross sectional view taken along the line 7C-7C in FIG. 7. An etching process is performed to remove excess conductive materials in the holes 104 to space adjacent conductive layers 108 from one another to prevent from bridging between adjacent conductive layers 108. In some embodiments of the present disclosure, the etching process may include an anisotropic etching process followed by a wet etching. The anisotropic etching process, e.g., reactive ion etching (RIE) process, using a patterned hard mask (not shown) as an etching mask to remove the conductive material in the multiple holes 104 with a boundary 104a. The wet etching is used to cause sidewall undercut or concaves 104b to the conductive layers 108 within each hole 104 such that adjacent conductive layers 108 can be spaced from one another to prevent from bridging.

Figure 8:
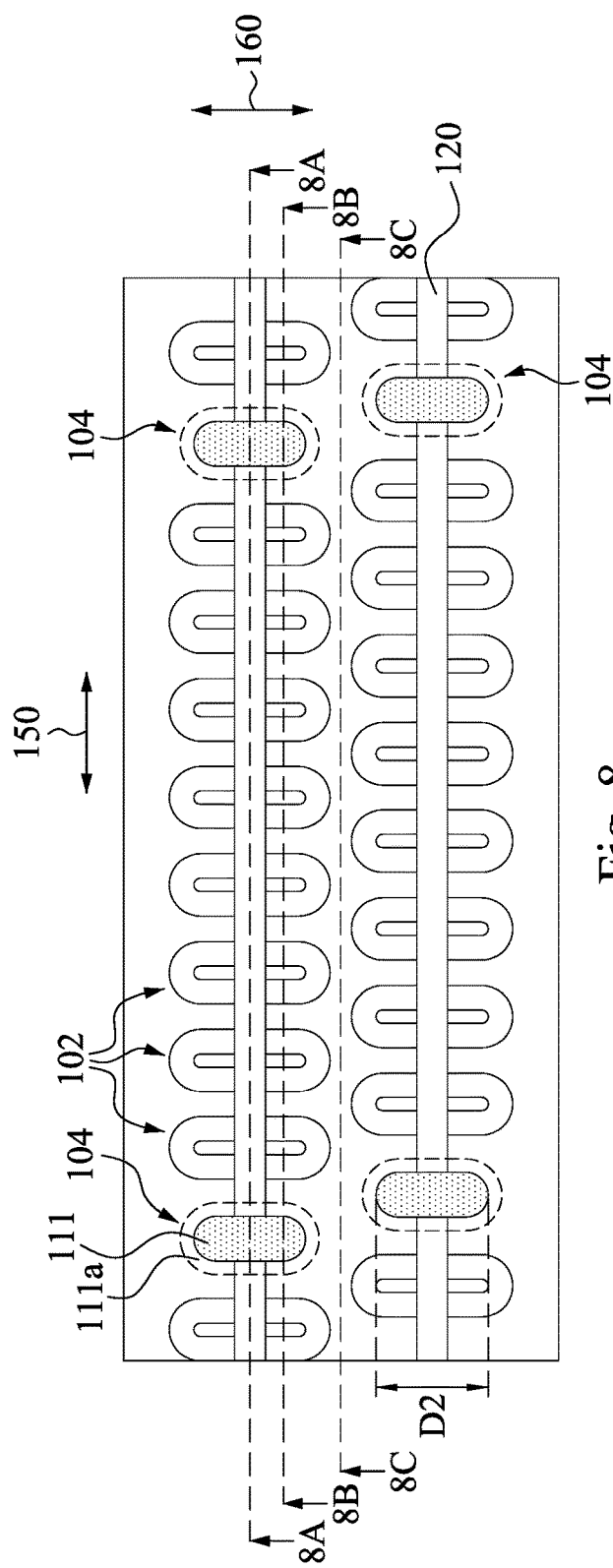
Figure 8A:
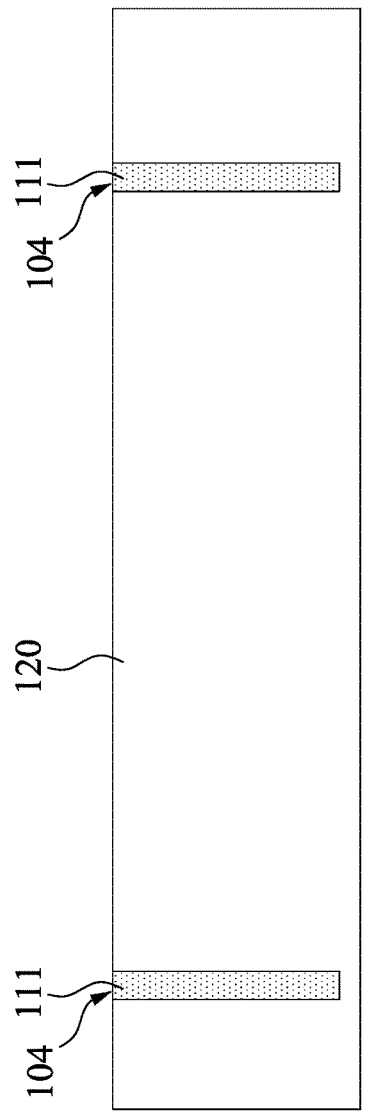
Figure 8B:
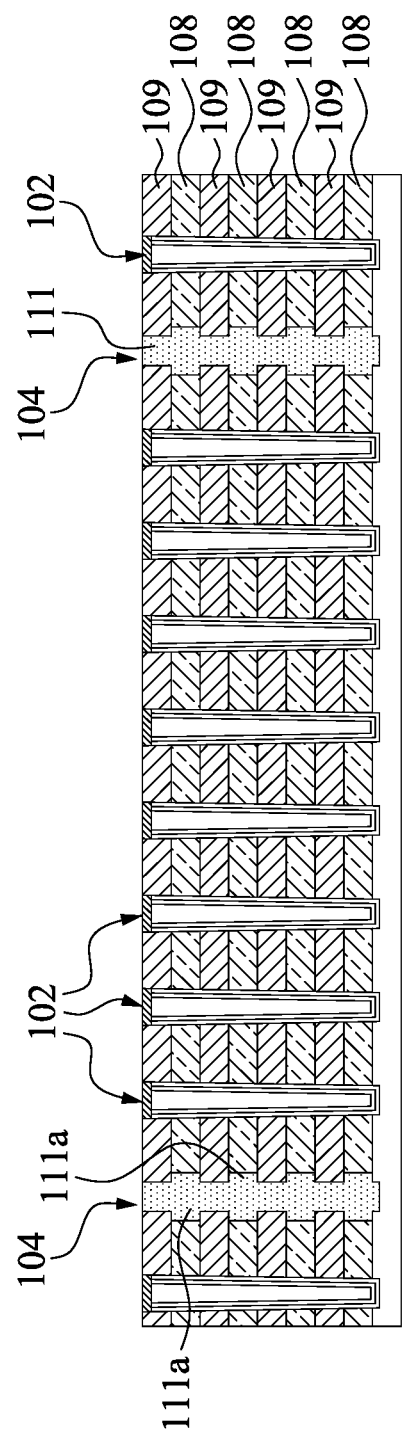
Figure 8C:
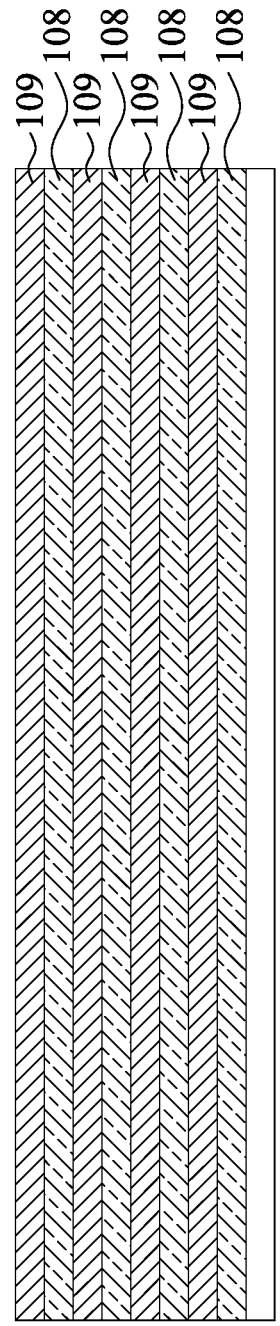

Reference is made to FIGS. 8-8C, FIG. 8A illustrates a cross sectional view taken along the line 8A-8A in FIG. 8, FIG. 8B illustrates a cross sectional view taken along the line 8B-8B in FIG. 8 and FIG. 8C illustrates a cross sectional view taken along the line 8C-8C in FIG. 8. A dielectric material is deposited into the multiple holes 104 to form dielectric fillers 111. Since each hole 104 has side concaves 104b, each dielectric filler 111 inside each hole 104 is equipped with side protrusions 111a in contact with the conductive layers 108 (referring to FIG. 9). Referring to FIG. 8A, each dielectric filler 111 is in contact with the isolation portion 120. Referring to FIG. 8, each dielectric filler 111 has a width (D2) greater than a width of the isolation portion 120 along the direction 160.

Figure 9:
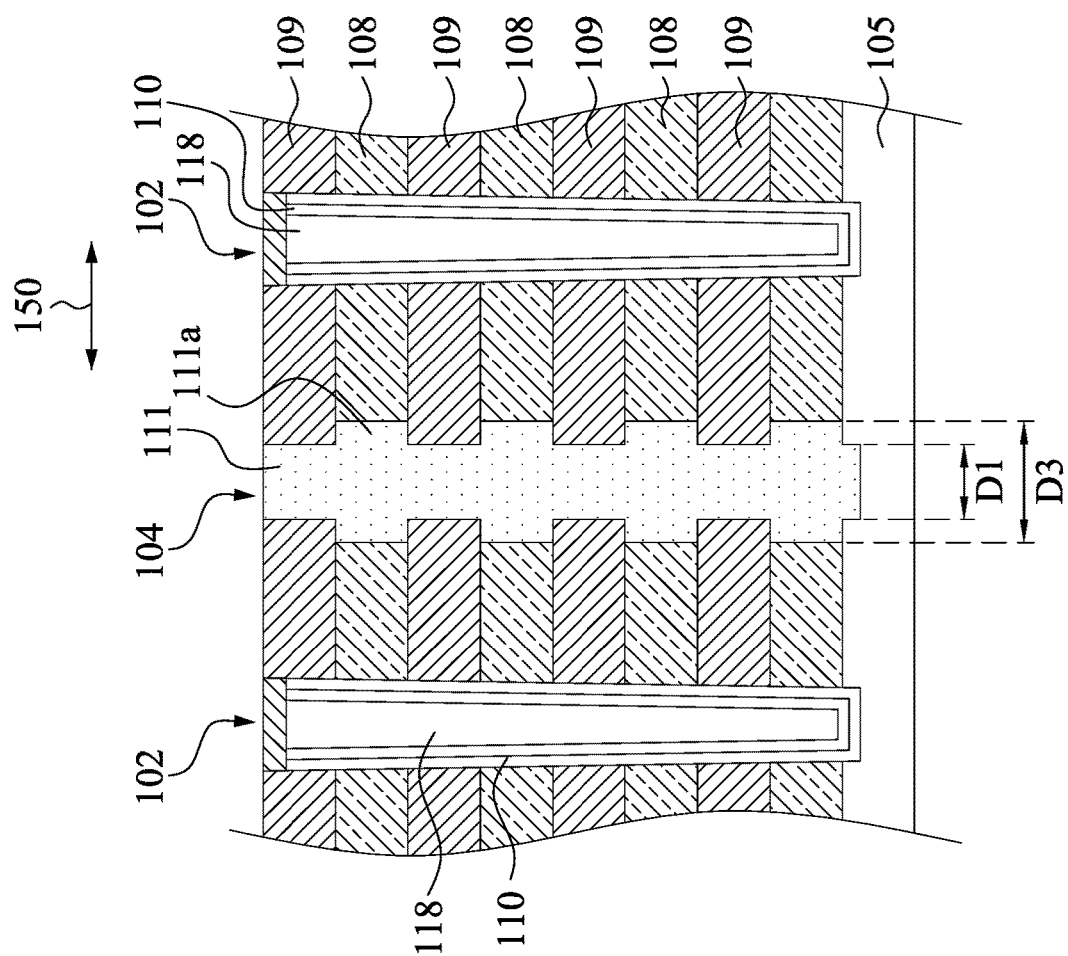
FIG. 9 illustrates a cross sectional view of a portion of a semiconductor memory device in accordance with one embodiment of the present disclosure.

Reference is made to FIG. 9, which illustrates an enlarged cross sectional view of a portion of FIG. 8B. Each dielectric filler 111 is located between corresponding two of the U-shaped memory layer stacks 110. Each side protrusion 111a of the dielectric filler 111 is sandwiched between immediately-adjacent two of the insulating layers 109, and has its end surface in contact a corresponding conductive layers 108. Each dielectric filler 111 has a width (D3) greater than an inner diameter (D1) of the hole 104 along the direction 150.

Figure 10:
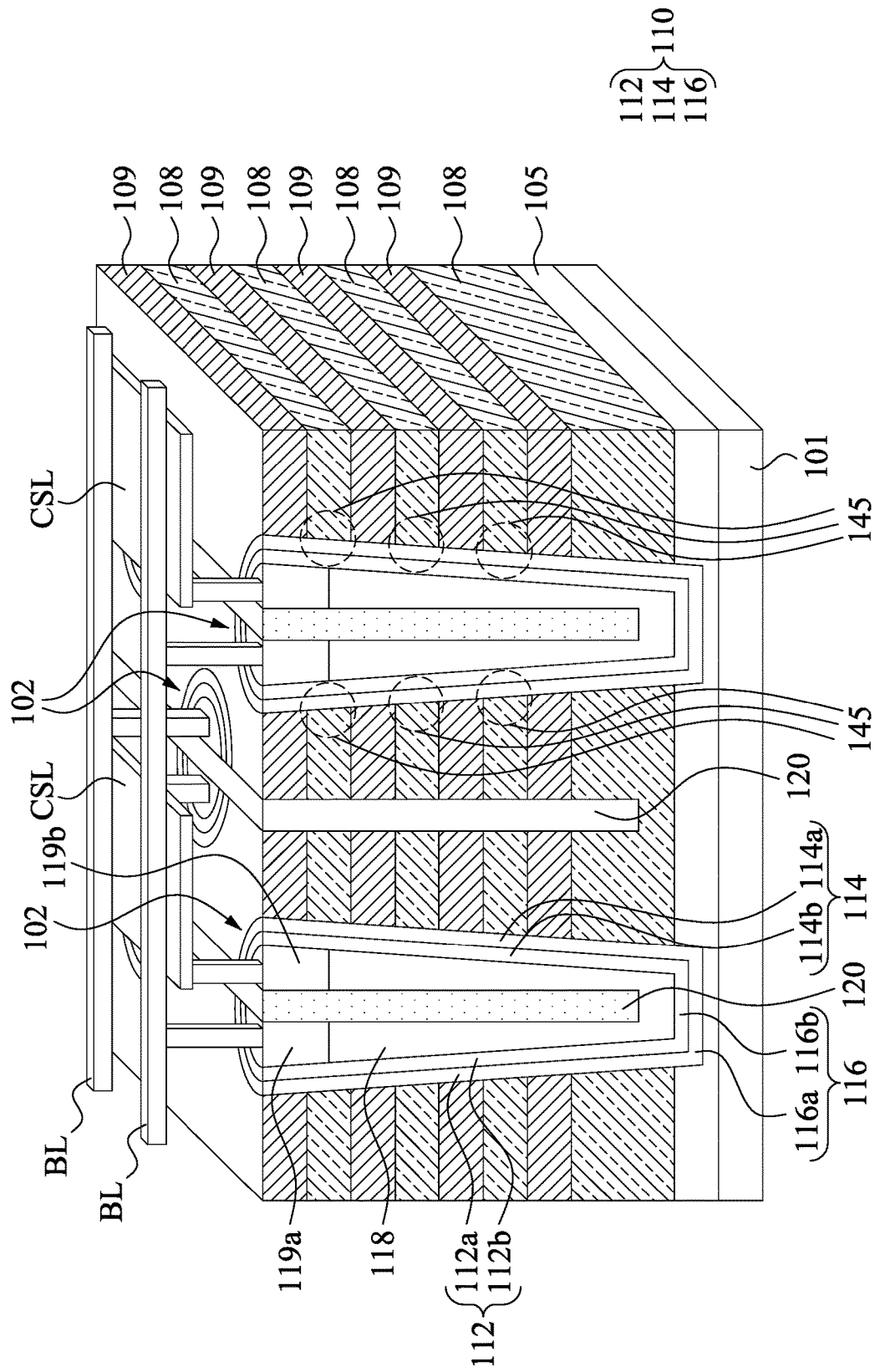
FIG. 10 illustrates a perspective view of a semiconductor memory device in accordance with one embodiment of the present disclosure.

Reference is made to FIG. 10, which illustrates a perspective view of a three-dimensional (3D) memory device 100 in accordance with one embodiment of the present disclosure. After the conductive layers 108 are formed in contact with sidewalls of the U-shaped memory layer stacks 110, a plurality of memory cells 145 can be formed on the intersectional points of the U-shaped memory layer stacks 110 and the conductive layers 108. The memory cells 145 can be electrically connected in series by the channel layer (112b, 114b, 116b) included in the U-shaped memory layer stack to form a U-shaped string. The isolation portion 120 has a bottommost end aligned with the corresponding bottommost conductive layer 108, or the bottommost end of the isolation portion (120) may be aligned with the buried oxide layer 105. The 3D memory device 100 may include interconnection layers, i.e., bit lines (BL) and common source lines (CSL), to be connected to the U-shaped memory layer stacks 110 in the holes 102. In particular, two contact plugs (119a, 119b) are formed at an opening end of each hole 102 and in contact with the channel layers (112b, 114b) respectively. One of the two contact plugs (119a, 119b) is connected to a bit lines (BL) and the other of the two contact plugs (119a, 119b) is connected to a common source line (CSL). Therefore, all memory cells 145 in the memory device 100 can be connected to the interconnection layers.

Figure 11:
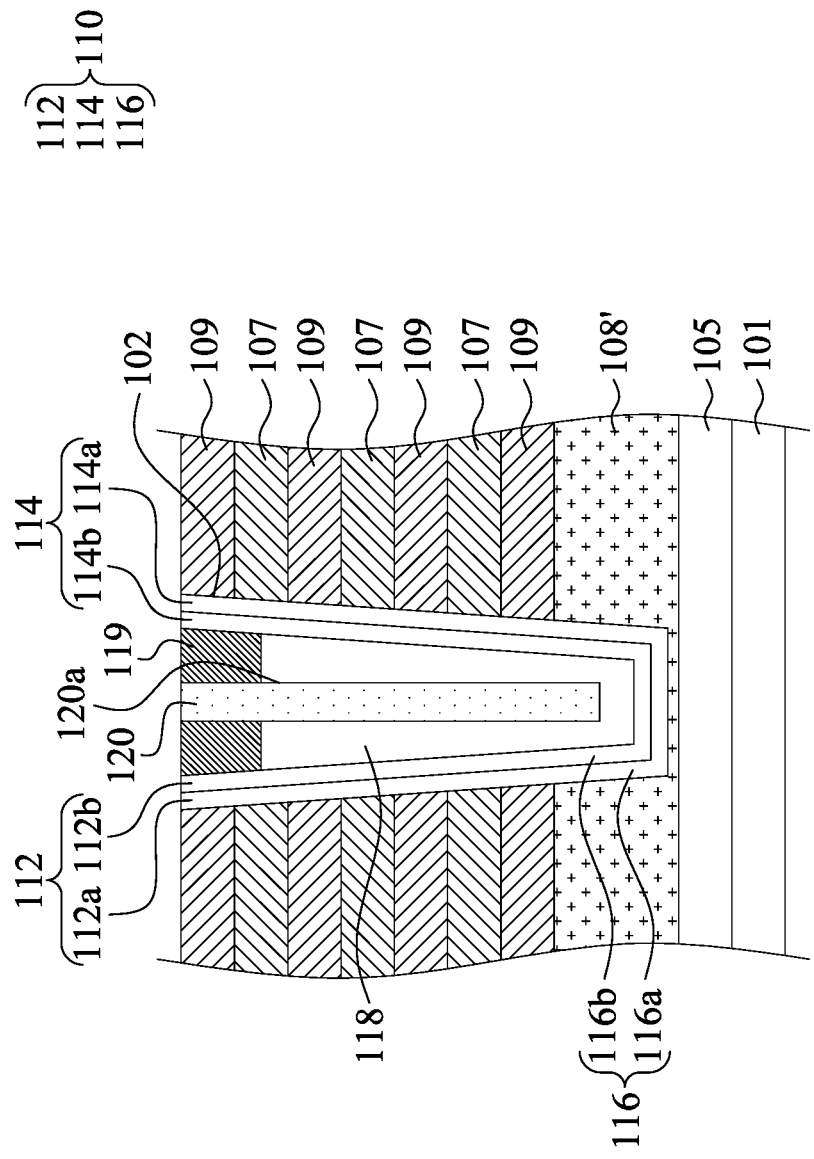
FIG. 11 illustrates a cross sectional view of the multi-layer stacked structure according to another embodiment of the present disclosure.
Figure 12:
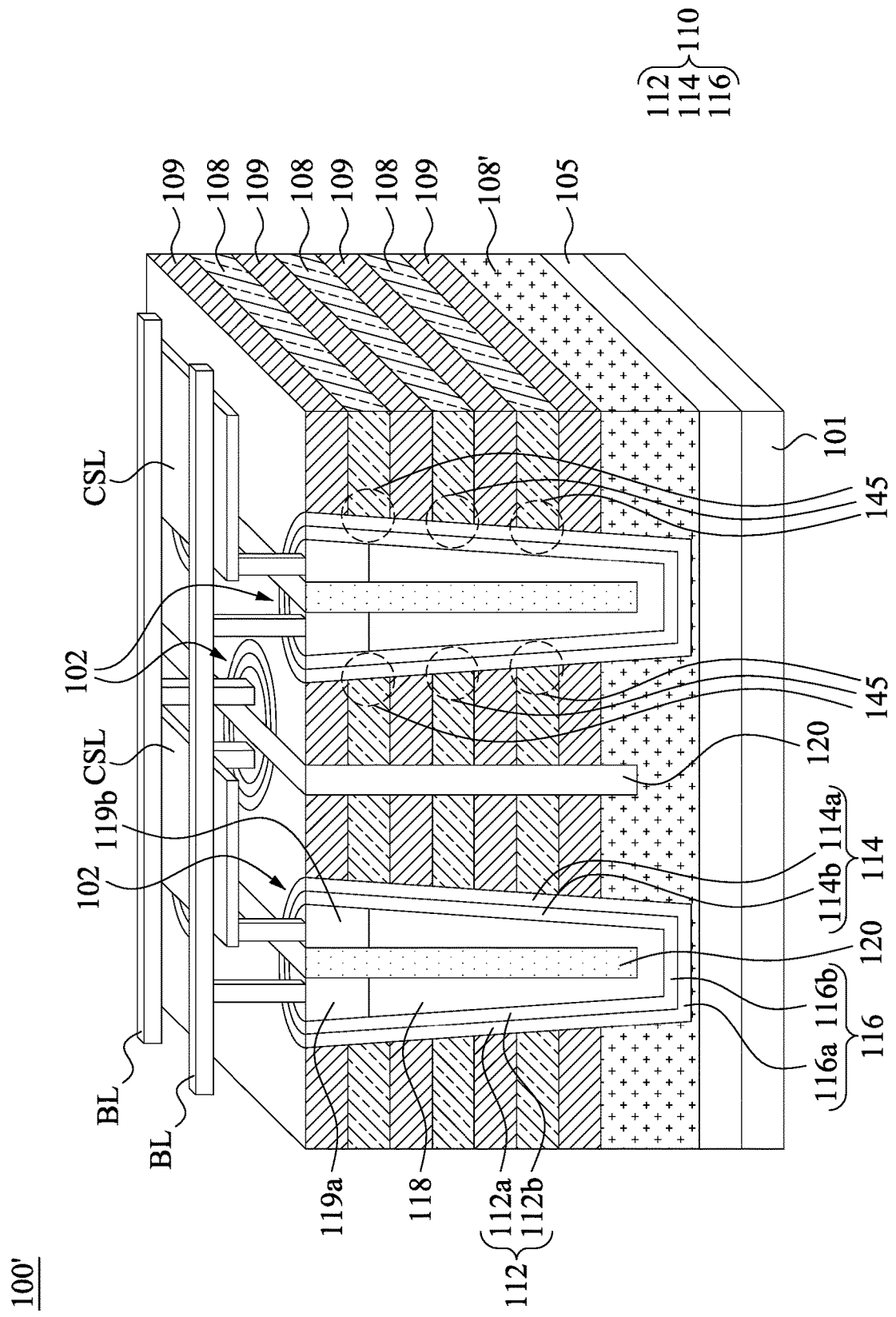
FIG. 12 illustrates a perspective view of a semiconductor memory device in accordance with another embodiment of the present disclosure.

Reference is made to FIGS. 11-12, a 3D memory device 100' is illustrated in accordance with another embodiment of the present disclosure, wherein FIG. 11 illustrates a cross-section of the 3D memory device 100' before the gate replacement steps. The 3D memory device 100' is different from the 3D memory device 100 in that a conductive layer 108', e.g., a ploy silicon layer, is formed between the buried oxide layer 105 and the multi-layer stacked structure (107, 109), and the holes 102 are etched to stop at the conductive layer 108'. In this embodiment, the 3D memory device 100' is basically manufactured by process steps similar to those of the 3D memory device 100 except that the conductive layer 108' is deposited before forming the multi-layer stacked structure (107, 109) and the bottommost conductive layer 108' is not etched while etching the insulating layers 107 to replace with the conductive layers 108 as discussed previously in FIGS. 1-10. In this embodiment, the bottom string portion 116 of the memory layer stack 110 is located in a corresponding bottommost conductive layer 108', i.e., a bottom gate, of the multi-layer stacked structure (108', 108, 109). The isolation portion (120) has a bottommost end aligned with the corresponding bottommost conductive layer 108'.

According to aforementioned embodiments, a hemi-cylindrical three-dimensional semiconductor memory device includes additional holes on the isolation portion to remove sacrificial insulating layers and replaced with conductive gate layers. The additional holes are etched or drilled after all hemi-cylindrical memory layer stacks are formed penetrating a multi-layer stacked structure of two different alternately stacked insulating layers. The gate replacement process can be performed through the additional holes to form metal conductive layers to replace the sacrificial insulating layers. Dielectric fillers with side protrusions are finally deposited into the additional holes to space adjacent conductive layers from one another. The hemi-cylindrical three-dimensional semiconductor memory device with metal gate layers may have a greater performance than the device with ploy gate layers.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A three-dimensional (3D) memory device, comprising:
a substrate;
a plurality of conductive layers and insulating layers alternately stacked over the substrate to form a multi-layer stacked structure, wherein the multi-layer stacked structure comprises multiple first holes arranged along a first direction, each first hole passing through the conductive layers and the insulating layers;
a memory layer stack having a first string portion disposed on a first side of a sidewall of each of the first holes, a second string portion disposed on an opposite second side of the sidewall, and a bottom string portion connected between the first and second string portions;
an isolation portion disposed along the first direction and embedded among the first, second and bottom string portions of each of the memory layer stacks in the first holes;

a second hole disposed between adjacent two of the first holes; and a dielectric filler disposed within the second hole, wherein the dielectric filler is in direct contact with the isolation portion.

2. The 3D memory device of claim 1, wherein the second hole has an inner diameter greater than a width of the isolation portion.

3. The 3D memory device of claim 2, wherein the dielectric filler has side protrusions.

4. The 3D memory device of claim 3, wherein at least one of the side protrusions has a width greater than the inner diameter of the second hole.

5. The 3D memory device of claim 3, wherein each side protrusion of the dielectric filler is sandwiched between immediately-adjacent two of the insulating layers.

6. The 3D memory device of claim 1, wherein the second hole has an inner diameter smaller than that of each of the first holes.

7. The 3D memory device of claim 1, wherein the conductive layers comprise tungsten and the insulating layers comprise silicon oxide.

8. The 3D memory device of claim 1, wherein the first and second string portions of the memory layer stack each comprises a U-shaped channel layer and a U-shaped storage layer wrapping around the channel layer.

9. The 3D memory device of claim 1, wherein the bottom string portion of the memory layer stack is disposed in a corresponding conductive layer of the multi-layer stacked structure.

10. The 3D memory device of claim 1, further comprising a buried oxide layer between the substrate and the multi-layer stacked structure, wherein the isolation portion has a bottommost end parallel with a bottommost one of the conductive layers of the multi-layer stacked structure or parallel with the buried oxide layer.

11. A three-dimensional (3D) memory device, comprising:

a substrate;

a plurality of conductive layers and insulating layers alternately stacked over the substrate to form a multi-layer stacked structure;

a plurality of U-shaped memory layer stacks disposed along a first direction and penetrating the multi-layer stacked structure;

a continuous isolation portion disposed along the first direction and embedded in concaves of the U-shaped memory layer stacks; and a dielectric filler penetrating the multi-layer stacked structure and having protrusions in contact with the conductive layers, wherein the dielectric filler is in direct contact with the isolation portion.

12. The 3D memory device of claim 11, wherein each protrusion of the dielectric filler is sandwiched between immediately-adjacent two of the insulating layers.

13. The 3D memory device of claim 11, wherein the dielectric filler has a width greater than that of the isolation portion.

* * * * *